(12) United States Patent
Jin et al.

(10) Patent No.: US 12,543,441 B2
(45) Date of Patent: Feb. 3, 2026

(54) DISPLAY PANEL AND DISPLAY DEVICE

(71) Applicant: Wuhan China Star Optoelectronics Semiconductor Display Technology Co., Ltd., Hubei (CN)

(72) Inventors: Meng Jin, Hubei (CN); Lei Lv, Hubei (IL); Tao Yuan, Hubei (IL); Jinchang Huang, Hubei (IL)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 1331 days.

(21) Appl. No.: 17/285,108

(22) PCT Filed: Mar. 23, 2021

(86) PCT No.: PCT/CN2021/082422
§ 371 (c)(1),
(2) Date: Aug. 18, 2022

(87) PCT Pub. No.: WO2022/170666
PCT Pub. Date: Aug. 18, 2022

(65) Prior Publication Data
US 2024/0032344 A1    Jan. 25, 2024

(30) Foreign Application Priority Data
Feb. 9, 2021    (CN) .......................... 202110178511.2

(51) Int. Cl.
*H10K 59/122*    (2023.01)
*H10K 59/65*    (2023.01)

(52) U.S. Cl.
CPC ........... *H10K 59/122* (2023.02); *H10K 59/65* (2023.02)

(58) Field of Classification Search
CPC ....... H10K 50/822; H10K 59/10; H10K 59/12
See application file for complete search history.

(56) References Cited

U.S. PATENT DOCUMENTS

| | | | |
|---|---|---|---|
| 11,569,214 B2* | 1/2023 | Zhang | H04N 23/57 |
| 11,899,862 B2* | 2/2024 | Bok | H04N 23/57 |
| 12,127,461 B2* | 10/2024 | Yang | H10K 59/124 |
| 2016/0293687 A1* | 10/2016 | Chang | H10K 59/8792 |
| 2017/0064173 A1* | 3/2017 | Yoo | G09G 3/3208 |

(Continued)

FOREIGN PATENT DOCUMENTS

| | | |
|---|---|---|
| CN | 104377227 | 2/2015 |
| CN | 104885251 | 9/2015 |

(Continued)

*Primary Examiner* — Dale E Page
*Assistant Examiner* — Rohit Parthasarathy (57) ABSTRACT

A display panel and a display device are provided. The display panel includes a first display region and a second display region. A light transmittance rate of the first display region is greater than a light transmittance rate of the second display region. In the first display region, the display panel includes pixel regions and light transmissive regions between the pixel regions. The display panel includes: a pixel definition layer defined with at least one light transmissive hole, wherein the light transmissive hole is located in the corresponding light transmissive region; an auxiliary layer located in the light transmissive hole; and a first electrode layer located on the auxiliary layer.

17 Claims, 5 Drawing Sheets

(56) References Cited

U.S. PATENT DOCUMENTS

| | | | | |
|---|---|---|---|---|
| 2020/0258964 A1* | 8/2020 | Kim | ................... | H10K 77/111 |
| 2021/0191552 A1* | 6/2021 | Bok | ................... | G06F 1/1681 |
| 2021/0193769 A1* | 6/2021 | Bok | ................... | G06F 1/1605 |
| 2021/0241671 A1* | 8/2021 | Lee | ................... | G09G 3/3225 |
| 2021/0305343 A1* | 9/2021 | Oh | ..................... | H10K 50/11 |
| 2022/0013594 A1* | 1/2022 | Wang | .................. | H10K 59/65 |
| 2024/0032346 A1* | 1/2024 | Jin | .................... | H10K 59/879 |

FOREIGN PATENT DOCUMENTS

| | | | | |
|---|---|---|---|---|
| CN | 109950415 | | 6/2019 | |
| CN | 110797383 | | 2/2020 | |
| CN | 110808271 | | 2/2020 | |
| CN | 111029381 | | 4/2020 | |
| CN | 111129102 | | 5/2020 | |
| CN | 111384284 | | 7/2020 | |
| CN | 111430439 | | 7/2020 | |
| CN | 111463356 | | 7/2020 | |
| CN | 111463356 A * | 7/2020 | ........... H10K 59/873 |
| CN | 111554716 | | 8/2020 | |
| CN | 111769149 | | 10/2020 | |
| CN | 111863892 | | 10/2020 | |
| CN | 111863895 | | 10/2020 | |
| CN | 111863900 | | 10/2020 | |
| CN | 112054048 | | 12/2020 | |
| CN | 112103318 | | 12/2020 | |
| CN | 113035910 | | 6/2021 | |

* cited by examiner

FIG. 8

DISPLAY PANEL AND DISPLAY DEVICE

RELATED APPLICATIONS

This application is a National Phase of PCT Patent Application No. PCT/CN2021/082422 having International filing date of Mar. 23, 2021, which claims the benefit of priority of Chinese Patent Application No. 202110178511.2 filed on Feb. 9, 2021. The contents of the above applications are all incorporated by reference as if fully set forth herein in their entirety.

FIELD AND BACKGROUND OF THE INVENTION

The present disclosure relates to the field of display, and particularly to a display panel and a display device.

Regarding camera-under-panel (CUP) display technology of the prior art, display panels include a first display region configured for both display and shooting and a second display region only configured for display. In order to enhance photographing effect of an under-screen camera, a light transmittance rate of the display panels in the first display region needs to be increased.

SUMMARY OF THE INVENTION

Embodiments of the present disclosure provides a display panel and a display device, which can improve a light transmittance rate of the display panel and improves imaging effect of an under-screen camera.

One embodiment of the present disclosure provides a display panel, including a first display region and a second display region. A light transmittance rate of the first display region is greater than a light transmittance rate of the second display region. In the first display region, the display panel includes pixel regions and light transmissive regions between the pixel regions. The display panel includes:

a pixel definition layer defined with at least one light transmissive hole, wherein the light transmissive hole is located in the corresponding light transmissive region;

an auxiliary layer including at least one auxiliary portion, wherein the auxiliary portion is located in the corresponding light transmissive hole; and a first electrode layer located on the auxiliary layer.

Optionally, in several embodiments of the present disclosure, the light transmissive hole includes a top opening, a bottom opening, and a lateral wall, and a size of the top opening is larger than a size of the bottom opening.

Optionally, in several embodiments of the present disclosure, the display panel further includes a second electrode layer; the pixel definition layer is disposed on the second electrode layer; the second electrode layer includes a plurality of second electrodes; each of the second electrodes is located in the corresponding pixel regions; a distance between an outer edge of the lateral wall at the bottom opening and an outer edge of an adjacent second electrode ranges from 2 to 5 microns.

Optionally, in several embodiments of the present disclosure, the display panel further includes a light emitting unit layer; the light emitting unit layer includes a first light emitting unit layer, a second light emitting unit layer, and a third light emitting unit layer disposed in a stack; the second light emitting unit layer is disposed between the first light emitting unit layer and the third light emitting unit layer; the pixel definition layer further includes a pixel opening corresponding to each of the second electrodes; the first light emitting unit layer is disposed on the pixel definition layer, covers the pixel opening and the light transmissive hole, and is located below the auxiliary layer; the second light emitting unit layer is disposed in the pixel opening; and the third light emitting unit layer covers the second light emitting unit layer and the first light emitting unit layer and is located below the auxiliary layer.

Optionally, in several embodiments of the present disclosure, the first electrode layer covers at least a part of regions of the third light emitting unit layer and the auxiliary portion.

Optionally, in several embodiments of the present disclosure, a thickness of the first electrode layer on the auxiliary layer is less than a thickness of the first electrode layer on the light emitting unit layer.

Optionally, in several embodiments of the present disclosure, the auxiliary portion covers the corresponding bottom opening of the light transmissive hole.

Optionally, in several embodiments of the present disclosure, the auxiliary portion includes a platform portion and an edge portion located at an edge of the platform portion; a thickness of the edge portion gradually decreases along a direction away from the platform portion; and the first electrode layer at least covers part of the edge portion.

Optionally, in several embodiments of the present disclosure, a thickness of the first electrode layer gradually decreases on the edge portion in a direction in which the thickness of the edge portion increases.

Optionally, in several embodiments of the present disclosure, the first electrode layer covers part of the edge portion.

Optionally, in several embodiments of the present disclosure, the first electrode layer completely covers the edge portion.

Optionally, in several embodiments of the present disclosure, the first electrode layer completely covers the auxiliary layer.

Optionally, in several embodiments of the present disclosure, the auxiliary layer covers part of the lateral wall of the light transmissive hole.

Optionally, in several embodiments of the present disclosure, the display panel includes a transparent filling layer, and the transparent filling layer is filled in the light transmissive hole and is located on the first electrode layer.

Optionally, in several embodiments of the present disclosure, a material of the transparent filling layer is a transparent organic material with a light transmittance rate greater than 95%.

Optionally, in several embodiments of the present disclosure, the transparent organic material includes poly(methyl methacrylate).

Correspondingly, one embodiment of the present disclosure further provides a display device including a display panel. The display panel includes a first display region and a second display region; a light transmittance rate of the first display region is greater than a light transmittance rate of the second display region; in the first display region, the display panel comprises pixel regions and light transmissive regions between the pixel regions; and the display panel includes:

a pixel definition layer defined with at least one light transmissive hole, wherein the light transmissive hole is located in the corresponding light transmissive region;

an auxiliary layer including at least one auxiliary portion, wherein the auxiliary portion is located in the corresponding light transmissive hole; and a first electrode layer located on the auxiliary layer.

Optionally, in several embodiments of the present disclosure, the light transmissive hole includes a top opening, a bottom opening, and a lateral wall, and a size of the top opening is larger than a size of the bottom opening.

Optionally, in several embodiments of the present disclosure, the display panel further includes a second electrode layer; the pixel definition layer is disposed on the second electrode layer; the second electrode layer includes a plurality of second electrodes; each of the second electrodes is located in the corresponding pixel regions; a distance between an outer edge of the lateral wall at the bottom opening and an outer edge of an adjacent second electrode ranges from 2 to 5 microns.

Optionally, in several embodiments of the present disclosure, the display panel includes a transparent filling layer, and the transparent filling layer is filled in the light transmissive hole and is located on the first electrode layer.

Embodiments of the present disclosure provide the display panel and the display device. The display panel includes the first display region and the second display region. The light transmittance rate of the first display region is greater than the light transmittance rate of the second display region. In the first display region, the display panel includes the pixel regions and the light transmissive regions between the pixel regions. The display panel includes the pixel definition layer defined with at least one light transmissive hole, wherein the light transmissive hole is located in the corresponding light transmissive region; the auxiliary layer including at least one auxiliary portion, wherein the auxiliary portion located in the corresponding light transmissive hole; and the first electrode layer located on the auxiliary layer. In the embodiments of the present disclosure, by defining the light transmissive hole in the light transmissive region of the pixel definition layer to remove the pixel definition layer in the light transmissive hole, the light transmittance rate on a region of the light transmissive hole is increased, thereby increasing the light transmittance rate of the first display region, improving the light transmittance rate of the display panel, and improving the imaging effect of the under-screen camera.

BRIEF DESCRIPTION OF THE SEVERAL VIEWS OF THE DRAWINGS

The technical solutions and other advantageous effects of the present invention will be apparent with reference to the following accompanying drawings and detailed description of embodiments of the present disclosure.

DESCRIPTION OF SPECIFIC EMBODIMENTS OF THE INVENTION

Aiming at a problem of low touch report rate in current active matrix organic light emitting diode (AMOLED) on-cell displays, the present disclosure provides an organic light emitting diode (OLED) display panel to ease this problem.

Embodiments of the present disclosure provide a display panel, a manufacturing method thereof, and a display device, which increase a light transmittance rate of the display panel and improve imaging effect of an under-screen camera. The details are described below respectively. It should be noted that a description order of the following embodiments is not intended to limit a preferred order of the embodiments.

Figure 1:
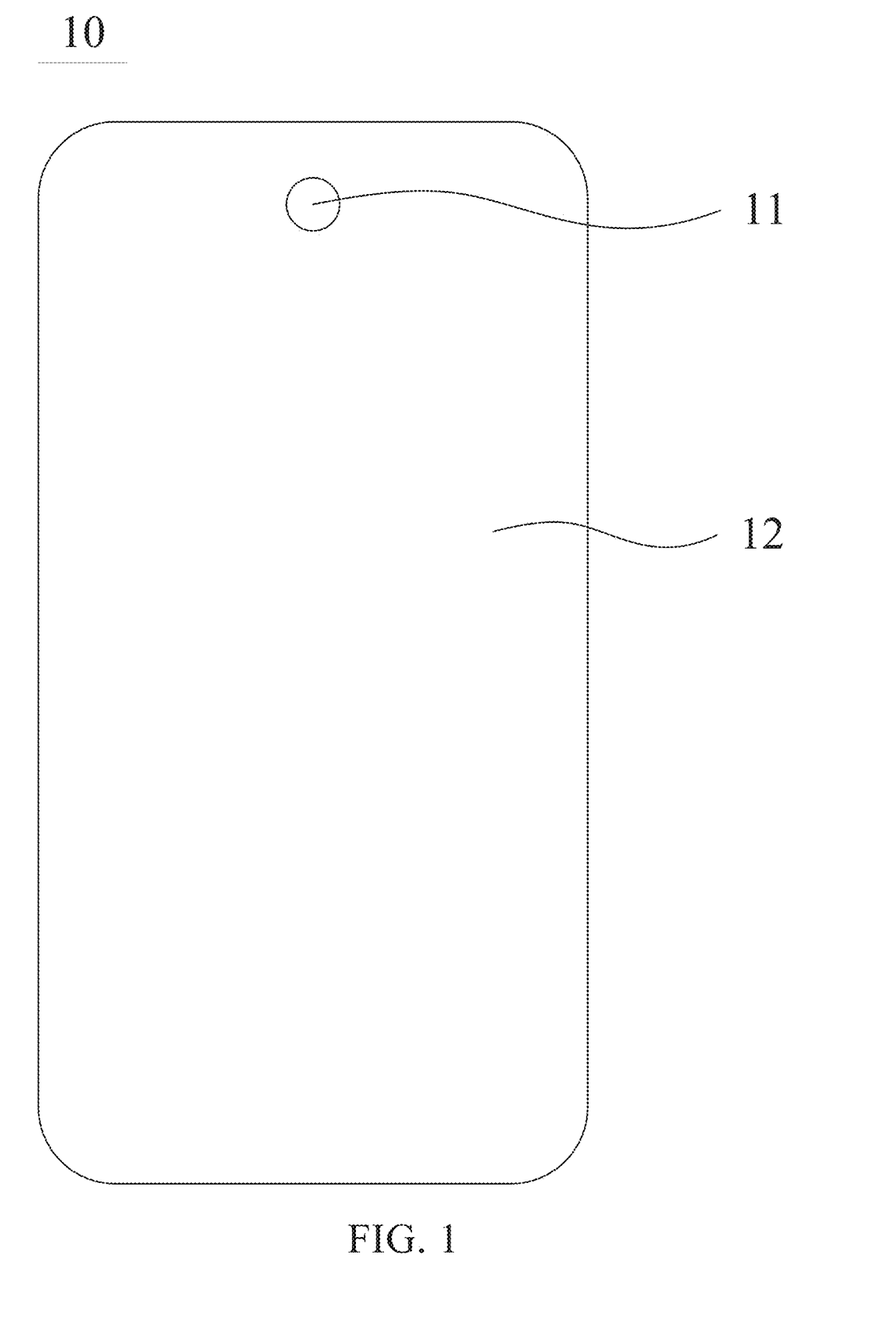
FIG. 1 is a schematic diagram of a first planar structure of a display panel provided by one embodiment of the present disclosure.
Figure 2:
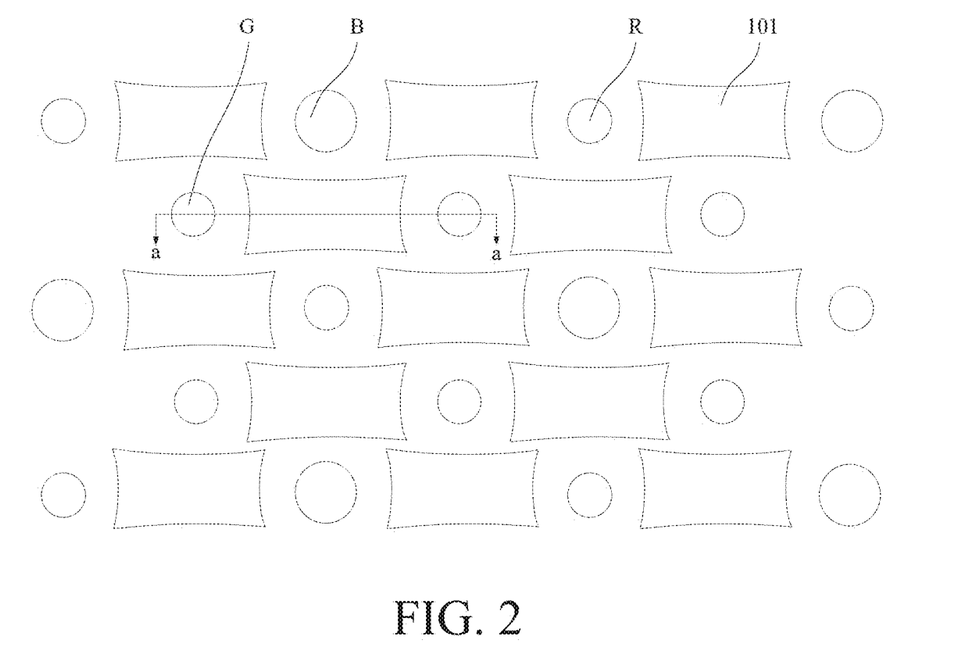
FIG. 2 is a schematic diagram of a second planar structure of the display panel provided by one embodiment of the present disclosure.
Figure 3:
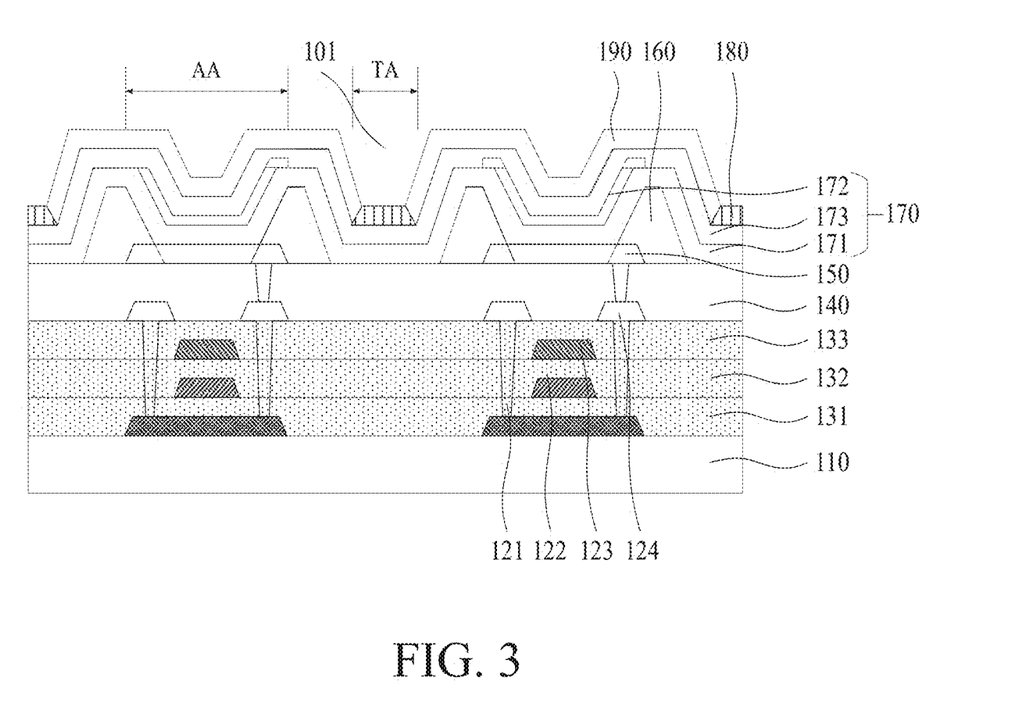
FIG. 3 is a schematic diagram of a first sectional structure of the display panel provided by one embodiment of the present disclosure.
Figure 4:
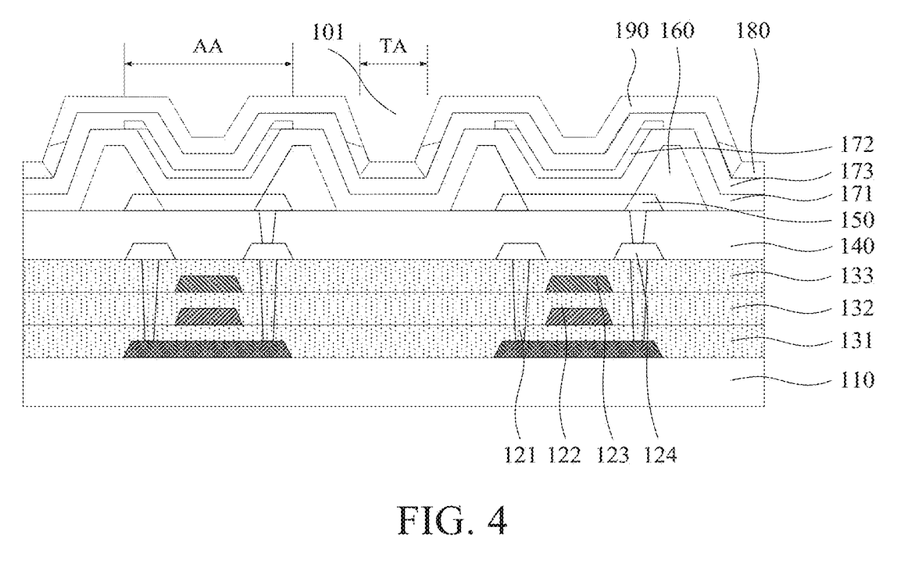
FIG. 4 is a schematic diagram of a second sectional structure of the display panel provided by one embodiment of the present disclosure.
Figure 5:
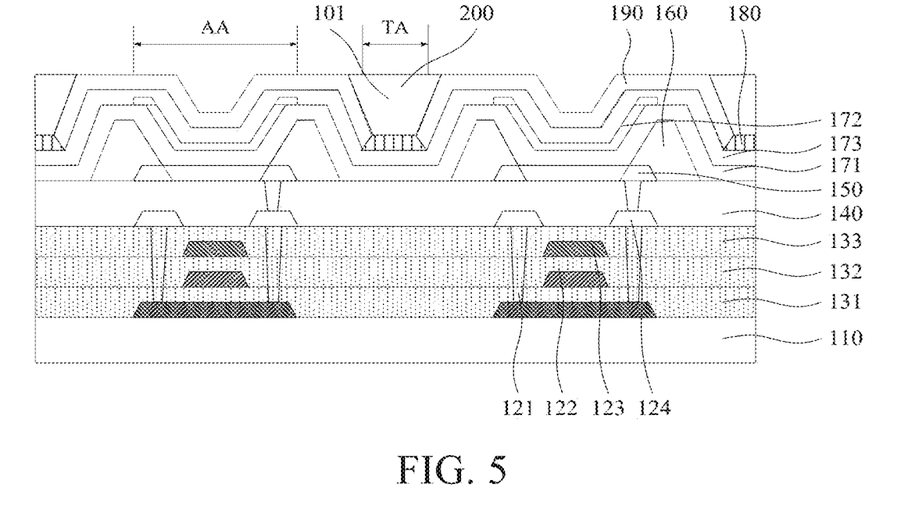
FIG. 5 is a schematic diagram of a third sectional structure of the display panel provided by one embodiment of the present disclosure.
Figure 6:
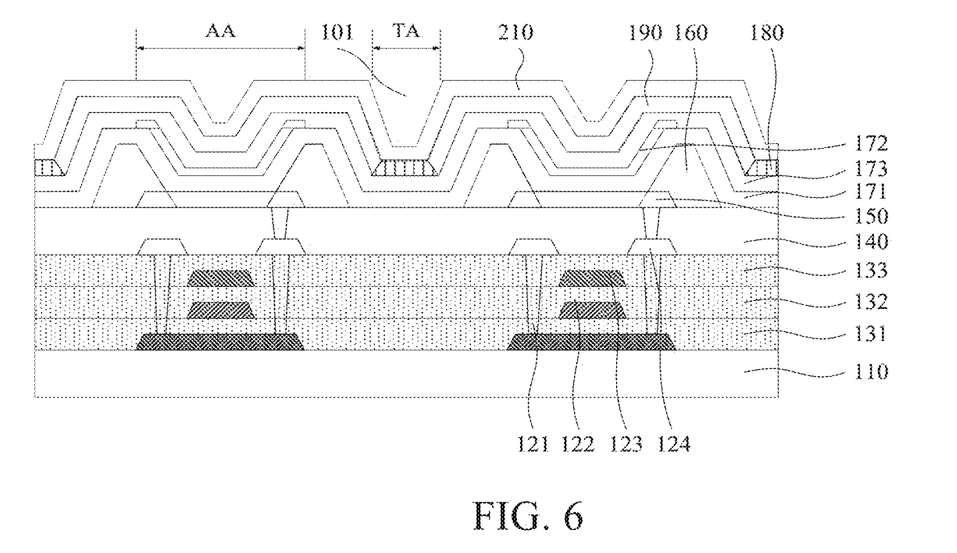
FIG. 6 is a schematic diagram of a fourth sectional structure of the display panel provided by one embodiment of the present disclosure.
Figure 7:
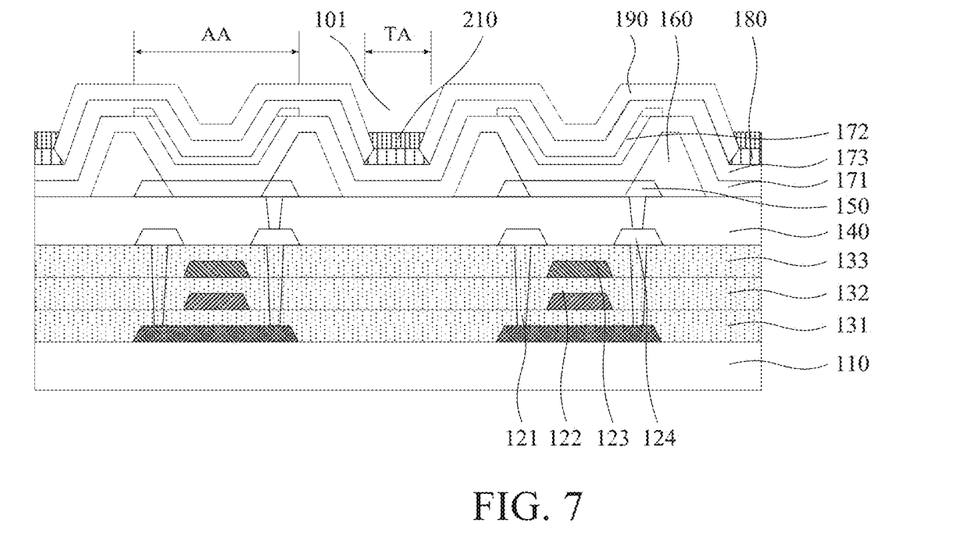
FIG. 7 is a schematic diagram of a fifth sectional structure of the display panel provided by one embodiment of the present disclosure.
Figure 8:
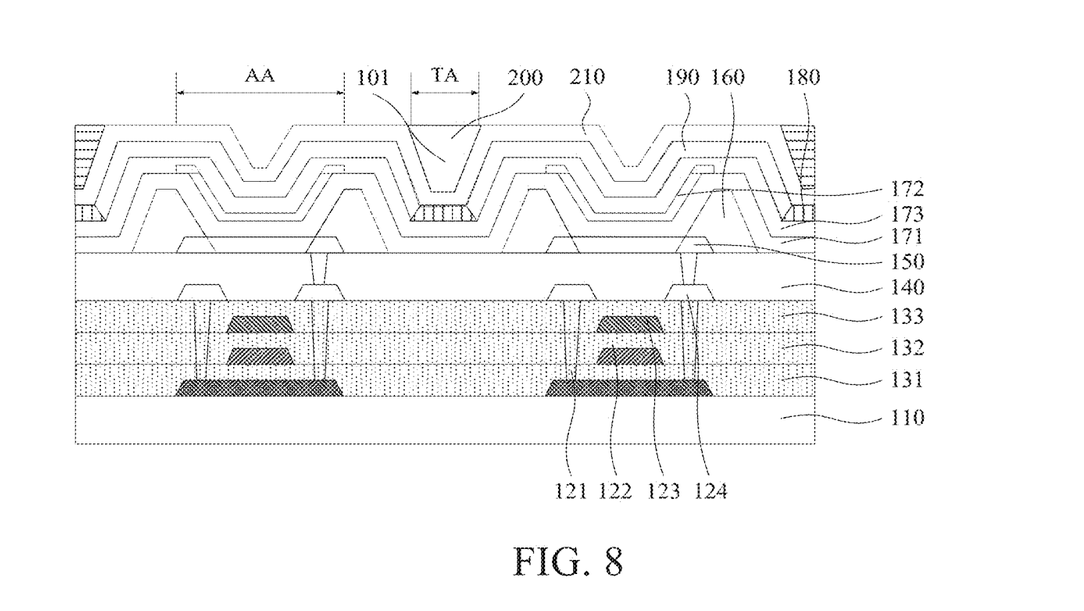
FIG. 8 is a schematic diagram of a sixth sectional structure of the display panel provided by one embodiment of the present disclosure.

In one embodiment, please refer to FIG. 1 to FIG. 8. A schematic diagram of a first planar structure of a display panel provided by one embodiment of the present disclosure is illustrated in FIG. 1. A schematic diagram of a second planar structure of the display panel provided by one embodiment of the present disclosure is illustrated in FIG. 2, which is specifically a schematic diagram of a partial planar structure of the first display region of the display panel provided by one embodiment of the present disclosure. A schematic diagram of a first sectional structure of the display panel provided by one embodiment of the present disclosure is illustrated in FIG. 3, which is specifically a schematic diagram of a partial sectional structure of the first display region of the display panel provided by one embodiment of the present disclosure, that is, a schematic diagram of a sectional structure along line aa in FIG. 2. A schematic diagram of a second sectional structure of the display panel provided by one embodiment of the present disclosure is illustrated in FIG. 4. A schematic diagram of a third sectional structure of the display panel provided by one embodiment of the present disclosure is illustrated in FIG. 5. A schematic diagram of a fourth sectional structure of the display panel provided by one embodiment of the present disclosure is illustrated in FIG. 6. A schematic diagram of a fifth sectional structure of the display panel provided by one embodiment of the present disclosure is illustrated in FIG. 7. A schematic diagram of a sixth sectional structure of the display panel provided by one embodiment of the present disclosure is illustrated in FIG. 8. As illustrated in the figures, the display panel 10 provided by embodiments of the present disclosure includes a first display region 11 and a second display region 12. A light transmittance rate of the first display region 11 is greater than a light transmittance rate of the second display region 12. In the first display region 11, the display panel 10 includes pixel regions AA and light transmissive regions TA between the pixel regions. The display panel 10 includes a pixel definition layer 160, an auxiliary layer 180, and a first electrode layer 190. Wherein, at least one light transmissive hole 101 is defined on the pixel definition layer 160; the light transmissive hole 101 is located in the corresponding light transmissive region TA; the auxiliary layer 180 includes at least one auxiliary portion 180; the auxiliary portion 180 is located in the corresponding light transmissive hole TA; and the first electrode layer 190 is located on the auxiliary layer 180.

Embodiments of the present disclosure provide a display panel. In the display panel, by defining the light transmissive hole in the light transmissive region of the pixel definition layer to remove the pixel definition layer in the light transmissive hole, the light transmittance rate on a region of the light transmissive hole is increased, thereby increasing the light transmittance rate of the first display region, improving the light transmittance rate of the display panel, and improving the imaging effect of the under-screen camera.

The display panel provided by the embodiments of the present disclosure will be further explained as follow with specific embodiments in combination with the drawings. The following embodiments are only for illustrating the display panel provided by the present disclosure by taking examples, but are not intended to limit the display panel provided by the present disclosure. Any display panel that conforms to the inventive concept of the present disclosure is within the scope of protection of the present disclosure.

In one embodiment as illustrated in FIG. 3, the display panel provided by the embodiment of the present disclosure specifically includes an array substrate, a second electrode layer 150, a pixel definition layer 160, a light emitting unit layer 170, an auxiliary layer 180, and a first electrode layer 190.

The array substrate further includes a base 110, a semiconductor active layer 121, a first insulation layer 131, a first gate electrode layer 122, a second insulation layer 132, a second gate electrode layer 123, a third insulation layer 133, a source/drain electrode layer 124, and a planarization layer 140 from top to bottom. Wherein, the base 110 can be a rigid base or a flexible base. Generally, the rigid base is a glass base. The flexible base includes a first organic base, an inorganic base, and a second inorganic, generally. The semiconductor active layer 121 is patterned to form an active region of a thin film transistor. A material of the semiconductor active layer 121 can be an oxide semiconductor material or can be a polycrystalline silicon material or a monocrystalline silicon material also. The first gate electrode layer 122 is patterned to form a first gate electrode of the thin film transistor. The second gate electrode layer 123 is patterned to form a second gate electrode of the thin film transistor. The source/drain electrode layer 124 is patterned to form a source electrode and a drain electrode of the thin film transistor. The thin film transistor and signal lines constitute a driving circuit of the display panel 10 together and are configured to drive the light emitting unit layer 170 to emit light for display. The first insulation layer 131 is disposed between the semiconductor active layer 121 and the first gate electrode layer 122. The second insulation layer 132 is disposed between the first gate electrode layer 122 and the second gate electrode layer 123. The third insulation layer 133 is disposed between the second gate electrode layer 123 and the source/drain electrode layer 124. The first insulation layer 131, the second insulation layer 132, and the third insulation layer 133 are respectively configured to isolate two conductive layers which are adjacent to themselves. The planarization layer 140 is configured for planarization of the array substrate to manufacture a flat base for the second electrode layer 150 on the planarization layer 140. A material of the planarization layer 140 is generally an organic matter.

The second electrode layer 150 is formed on the array substrate and is patterned to form second electrodes 150 which are spaced apart and are independent to each other. The second electrodes 150 are located in the pixel region AA of the display panel 10.

The pixel definition layer 160 is formed on the second electrodes 150 and is patterned to form pixel openings and light transmissive holes 101 which are spaced apart. Wherein, the pixel openings are located in the pixel region AA, correspond to the second electrodes 150, and expose the second electrodes 150. The light transmissive holes 101 are located in the light transmissive region TA, penetrate the pixel definition layer 160, and expose the planarization layer 140. The light transmissive hole 101 includes a top opening, a bottom opening, and a lateral wall connected between the top opening and the bottom opening. A size of the top opening is larger than a size of the bottom opening. A distance between an outer edge of the lateral wall at the bottom opening and an outer edge of an adjacent second electrode 150 ranges from 2 to 5 microns. In the embodiments of the present disclosure, by defining the light transmissive hole 101 in the light transmissive region TA of the pixel definition layer 160 to remove the pixel definition layer 160 in the light transmissive hole 101, the light transmittance rate of on a region of the light transmissive hole 101 is increased, thereby increasing the light transmittance rate of the first display region 11, improving the light transmittance rate of the display panel, and improving the imaging effect of the under-screen camera.

The light emitting unit layer 170 is formed on the planarization layer 140, the second electrode layer 150, and the pixel definition layer 160. The light emitting unit layer 170 includes a first light emitting unit layer 171, a second light emitting unit layer 172, and a third light emitting unit layer 173. When the first electrode layer 190 is a common electrode layer, and the second electrode layer 150 is a pixel electrode layer, the first light emitting unit layer 171 is a hole transport layer, and the third light emitting unit layer 173 is an electron transport layer. When the first electrode layer 190 is the pixel electrode layer, and the second electrode layer 150 is the common electrode layer, the first light emitting unit layer 171 is the electron transport layer, and the third light emitting unit layer 173 is the hole transport layer. The first electrode layer 190 being the common electrode layer and the second electrode layer 150 being the pixel electrode layer are taken as an example in one embodiment of the present disclosure. The hole transport layer is a material with high hole mobility, high thermal stability, and good blocking ability for electrons and excitons. The material of the hole transport layer is generally one or several of 4,4',4'-Tris[2-naphthyl(phenyl)amino]triphenylamine (2TNATA), N,N'-Di-[(1-naphthalenyl)-N,N'-diphenyl]-1,1'-biphenyl)-4,4'-diamine (NPB), or 4,4'-cyclohexylidenebis[N,N-bis(p-tolyl)aniline] (TAPC). The electron transport layer is a material with high electron mobility, high thermal stability, and good blocking ability for holes and excitons. The material of the electron transport layer is one or several of 2,2',2"-(1,3,5-Benzinetriyl)-tris(1-phenyl-1-H-benzimidazole) (TPBi), 4,7-diphenyl-1,10-phenanthroline (BPhen), or 1,3,5-tri[(3-pyridyl)-phen-3-yl]benzene (TmPyPB). The second light emitting unit layer 172 is a light emitting material layer, which includes a red light emitting material layer, a green light emitting material layer, and a blue light emitting material layer, and is configured to emit colors of corresponding pixels. As illustrated in FIG. 2, the pixels include red pixels R, green pixels G, and blue pixels B. In one embodiment of the present disclosure, a structure of the pixels can be as the structure illustrated in FIG. 2 and can be other structures well known in the art, which is not limited herein. In order to improve efficiency of electrons and holes injected in the light emitting material layer, the first light emitting unit layer 171 can further be a composite film layer of the hole transport layer and a hole injection layer, wherein the hole injection layer is located between the hole transport layer and the light emitting material layer; and the third light-emitting unit layer 173 can further be a composite film layer of the electron transport layer and an electron injection layer, wherein the electron injection layer is located between the electron transport layer and the light emitting material layer. The first light emitting unit layer 171 is disposed as an entire layer, covers the pixel region AA and the light transmissive region TA, is deposited on the pixel definition layer 160, covers the pixel openings and the light transmissive holes of the pixel definition layer 160, and is in contact with the second electrode 150. The second light emitting unit layer 172 is disposed in the pixel opening, is deposited on the first light emitting unit layer 171, and corresponds to the second electrode 150 corresponding to it. The third light emitting unit layer 173 is disposed as an entire layer, covers the pixel region AA and the light transmissive region TA, and is deposited on the first light emitting unit layer 171 and the second light emitting unit layer 172.

The auxiliary layer 180 is disposed on the third light emitting unit layer 173, and is patterned to form auxiliary portions 180 spaced apart and independent to each other. The auxiliary portions 180 are located in the corresponding light transmissive holes 101. A distance between an edge of the auxiliary portion 180 and an outer edge of the pixel regions ranges from 2 to 5 microns. A projection of the auxiliary portion 180 on the base 110 does not overlap with a projection of the second electrode 150 on the base. In the display panel provided by one embodiment of the present disclosure, a material of the auxiliary layer 180 is a transparent anti-adhesion material, which is specifically a material that has weak adhesion and mismatching surface energy to the first electrode layer 190, including but not limited to N,N'-diphenyl-N,N'-bis(9-phenyl-9H-carbazol-3-yl)biphenyl-4,4'-diamine), N-(diphenyl-4-yl)-9,9-dimethyl-N-(4-(9-phenyl-9H-carbazol-3-yl)phenyl)-9H-fluorene-2-amine, 2-(4-(9,10-di(naphthalene-2-yl)anthracene-2-yl)phenyl)-1-phenyl-1H-benzo-[D]imidazole, 4,4',4"-tris(N-3-methylphenyl-N-phenylamino)triphenylamine, N,N'-bis(1-naphthyl)-N,N'-diphenyl[1,1'-biphenyl]-4,4'-diamine, 4,4'-Bis[N-(3-methylphenyl)-N-phenylamino]biphenyl, bis(2-methyl-8-quinolinolato-N1,O8)-(1,1'-Biphenyl-4-olato) aluminum (BAIq), or 3-(Biphenyl-4-yl)-5-(4-tert-butylphenyl)-4-phenyl-4H-1,2,4-triazole (TAZ).

The first electrode layer 190 is disposed on the third light emitting unit layer 173 and at least covers the third light emitting unit layer 173. The first electrode layer 190 is a non-transparent electrode layer, has a function of reflecting a light emitted from the second light emitting unit layer 172, and has a function of blocking external light from entering the display panel 10 through the light transmissive region TA. In one embodiment of the present disclosure, the first electrode layer 190 is the common electrode layer, which may be made of a metal with a low work function including silver (Ag), magnesium (Mg), aluminum (AI), platinum (Pt), and palladium (Pd), gold (Au), nickel (Ni), neodymium (Nd), iridium (Ir), chromium (Cr), lithium (Li) or calcium (Ca). Preferably, the first electrode layer 190 is a magnesium or magnesium alloy metal layer.

The material of the auxiliary layer 180 is an anti-adhesion material, the anti-adhesion material does not match the surface energy of the material of the first electrode layer 190, and the material of the third light emitting unit layer 173 is a non-adhesion-proof material matching with the surface energy of the material of the first electrode layer 190. In this way, an adhesion force of the first electrode layer 190 on the auxiliary layer 180 is less than an adhesion force of the first electrode layer 190 on the third light emitting unit layer 173. Therefore, the thickness of the first electrode layer 190 located on the auxiliary layer 180 is less than the thickness of the first electrode layer 190 located on the third light emitting unit layer 173. Furthermore, the adhesion force of the first electrode layer 190 on the auxiliary layer 180 gradually decreases as a thickness of the auxiliary layer 180 increases, and when the thickness of the auxiliary layer 180 reaches a certain value d, the adhesion force of the first electrode layer 190 on the auxiliary layer 180 reaches a limit value, than the first electrode layer 190 is not able to adhere to the auxiliary layer 180, that is, the first electrode layer 190 is not disposed on the auxiliary layer 180 with the thickness greater than d. Therefore, by controlling the thickness of the auxiliary layer 180, a deposition thickness of the first electrode layer 190 on the auxiliary layer 180 can be controlled, thereby realizing removal of a corresponding part of the first electrode layer 190 or thinning of the first electrode layer 190. In one embodiment of the present disclosure, the thickness of the first electrode layer 190 located on the third light emitting unit layer 173 ranges from 100-150 nanometers, and the thickness of the auxiliary layer 180 is less than or equal to the thickness of the first electrode layer 190 located on the third light emitting unit layer 173.

In the embodiment of the present disclosure, by disposing the auxiliary part 180 on the light emitting unit layer 173 in the light transmissive hole 101 and by using the characteristic that the material of the auxiliary part 180 does match with the surface energy of the first electrode layer 190, the function of thinning or removing the first electrode layer 190 on the auxiliary part 180 is realized, and the light transmittance rate on the region of the light transmissive hole 101 is further improved. Therefore, the light transmittance rate of the first display region 11 is increased, the light transmittance rate of the display panel is improved, and the imaging effect of the under-screen camera is improved.

In one of the embodiment, as illustrated in FIG. 3, the auxiliary portion 180 covers the corresponding bottom opening of the light transmissive hole 101; the auxiliary portion 180 includes a platform portion and an edge portion located at an edge of the platform portion; a thickness of the edge portion gradually decreases along a direction away from the platform portion; the first electrode layer 190 covers the light emitting unit layer and at least part of the auxiliary portion 180; and the thickness of the first electrode layer 190 on the auxiliary part 180 gradually decreases as the thickness of the auxiliary part 180 increases. In one embodiment, a thickness of the platform portion of the auxiliary layer 180 is greater than d, and the first electrode layer 190 covers the third light emitting unit layer 173 and part of the edge portion. In another embodiment, the thickness of the platform portion of the auxiliary layer 180 is equal to d, and the first electrode layer 190 covers the third light emitting unit layer 173 and the entire edge portion. In another embodiment, the thickness of the platform portion of the auxiliary layer 180 is less than d, and the first electrode layer 190 covers the third light emitting unit layer 173 and the entire auxiliary portion 180. In this embodiment, the first electrode layer 190 completely covers the third light emitting unit layer 173 in the light transmissive hole 101, that is, the first electrode layer 190 covers lateral sides of the light transmissive hole 101. The first electrode layer 190 on the lateral side of the light transmissive hole 101 improves reflection of the light transmissive region to the light emitted by the display panel, reduces brightness of the light transmissive region, which reduces brightness difference between the first display region and the second display region and improves brightness uniformity of the display panel.

In another embodiment, as illustrated in FIG. 4, the auxiliary portion 180 covers the corresponding bottom opening and at least part of the lateral wall of the light transmissive hole 101. The auxiliary portion 180 includes a bottom section covering the bottom opening and a lateral section covering the lateral wall. The first electrode layer 190 covers light emitting unit layer and at least part of the auxiliary portion 180, and the thickness of the first electrode layer 190 on the auxiliary part 180 gradually decreases as the thickness of the auxiliary part 180 increases. In one embodiment, the thickness of the bottom section of the auxiliary portion 180 is greater than or equal to d, and the first electrode layer 190 covers the third light emitting unit layer 173 and part of the lateral section. In another embodiment, the thickness of the auxiliary layer 180 is less than d, and the first electrode layer 190 covers the third light emitting unit layer 173 and the entire auxiliary portion 180. Compared to the previous embodiment, this embodiment enlarges an area of the auxiliary portion 180, enlarges an area of thinned or removed area of the first electrode layer 190, and further improves the light transmittance rate on the region of the light transmissive hole 101, thereby increasing the light transmittance rate of the first display region 11. In this embodiment, the first electrode layer 190 covers at least part of the lateral sides of the light transmissive hole 101. The first electrode layer 190 on the lateral side of the light transmissive hole 101 improves reflection of the light transmissive region to the light emitted by the display panel, which reduces brightness of the light transmissive region, reduces brightness difference between the first display region and the second display region, and improves brightness uniformity of the display panel.

In one embodiment, as illustrated in FIG. 5, the display panel provided by one embodiment of the present disclosure further includes a transparent filling layer 200. The transparent filling layer 200 is filled in the light transmissive hole 101 and is located on the first electrode layer 190. An upper surface of the transparent filling layer 200 is flush with an upper surface of the first electrode layer 190 out of the light transmissive hole 101. A material of the transparent filling layer is a transparent organic material with a light transmittance rate greater than 95%, which includes but is not limited to polymethylmethacrylate. Because the light transmissive hole 101 penetrates the pixel definition layer 160, following layers form level difference at the position of the light-transmitting hole 101, which is not conducive to manufacturing of the following layers. Therefore, disposing the transparent filling layer 200 with the light transmittance rate greater than 95% in the light transmissive hole 101 serves a function of planarization for the display panel under a premise of ensuring the light transmittance rate on the region of the light transmissive hole 101.

In one embodiment, as illustrated in FIG. 6 and FIG. 7, the display panel provided by the embodiment of the present disclosure further includes a transparent auxiliary electrode layer 210. The transparent auxiliary electrode layer 210 is disposed on the first electrode layer 190, at least completely covers the auxiliary layer 180, is electrically connected to the first electrode layer 190, is configured to assist the first electrode layer 190 to provide electrical signals to the display panel, reduces an electric resistance rate of the first electrode layer 190, and increases conductivity of the display panel and reduces voltage drop of the display panel under a premise of not influencing the light transmittance rate of the display panel in the light transmissive region. A material of the transparent auxiliary electrode layer 210 is a transparent conductive material, which includes but is not limited to indium tin oxide, indium zinc oxide, aluminum zinc oxide, indium gallium zinc oxide, or a metal or an alloy less than 60 angstroms. A thickness of the transparent auxiliary electrode layer 210 ranges from 20 to 200 nanometers. A refractive index of the transparent auxiliary electrode layer 210 ranges from 1.8 to 2.1.

In one embodiment, as illustrated in FIG. 6, the transparent auxiliary electrode layer 210 is disposed as an entire layer, that is, the transparent auxiliary electrode layer 210 completely covers the first electrode layer 190 and the auxiliary layer 180. In this way, the transparent auxiliary electrode layer 210 is bonded to and is in contact with the first electrode layer 190, and the transparent auxiliary electrode layer 210 acts as a part of the first electrode and provides electrical signals for the display panel with the first electrode layer 190 together, which is equivalent to the thickness of the first electrode being increased by the transparent auxiliary electrode layer 210, and increments of the thickness of the first electrode on the auxiliary layer 180 and the thickness of the first electrode on other region outside the auxiliary layer 180 are also included. Therefore, conductivity of the entire first electrode increases, thereby increasing the conductivity of the display panel and reducing the voltage drop of the display panel. On the basis of the embodiment, the display panel can further include protective layers. The protective layers are disposed spaced apart in the pixel regions AA, are disposed between the first electrode layer 190 and the transparent auxiliary electrode layer 210, and corresponds to the light emitting material layer 172 in the pixel region AA where they are located. A material of the protective layer is a transparent high-temperature resistant material, which includes but is not limited to silicon oxide, silicon nitride, or silicon oxynitride. The protective layer prevents the light emitting material layer 172 from high temperature damage during manufacturing processes of the transparent auxiliary electrode layer 210 and protects the light emitting material layer 172, ensuring light emitting quality of the display panel.

In another embodiment, as illustrated in FIG. 7, the transparent auxiliary electrode layer 210 includes a plurality of transparent auxiliary electrodes 210 spaced apart. Each of the transparent auxiliary electrodes 210 completely covers the corresponding auxiliary portion 180 and the first electrode layer 190 located on the corresponding auxiliary portion 180. As same, this embodiment compensates for the thinned or removed first electrode layer in the light transmissive region to improve the conductivity of the first electrode, thereby increasing the conductivity of the display panel, and reducing the voltage drop of the display panel. Compared to the previous embodiment, this embodiment reduces the area of the transparent auxiliary electrode layer and reduces the material cost of the auxiliary electrode layer. Furthermore, the transparent auxiliary electrode 210 extends to periphery of the auxiliary portion 180 and covers part of the first electrode layer 190 on the third light emitting unit layer 173, and a distance that the transparent auxiliary electrode 210 extends out of the auxiliary portion 180 ranges from 2 to 5 microns, that is, the distance between the transparent auxiliary electrode 210 and the auxiliary portion 180 ranges from 2 to 5 microns. In this way, good contact between the transparent auxiliary electrode 210 and the first electrode layer 190 is ensured, and poor electrical contact incurred by the transparent auxiliary electrode 210 being only in contact with the first electrode layer 190 on the auxiliary portion 180 is prevented.

In one embodiment, as illustrated in FIG. 8, the display panel provided by the embodiment of the present disclosure further includes the transparent filling layer 200 and the transparent auxiliary electrode layer 210. The transparent auxiliary electrode layer 210 is disposed on the first electrode layer 190, at least completely covers the auxiliary layer 180, is electrically connected to the first electrode layer 190, is configured to assist the first electrode layer 190 to provide electrical signals to the display panel, reduces an electric resistance rate of the first electrode layer 190, and increases conductivity of the display panel and reduces voltage drop of the display panel under a premise of not influencing the light transmittance rate of the display panel in the light transmissive region. A material of the transparent auxiliary electrode layer 210 is a transparent conductive material, which includes but is not limited to indium tin oxide, indium zinc oxide, aluminum zinc oxide, indium gallium zinc oxide, or a metal or an alloy less than 60 angstroms. The thickness of the transparent auxiliary electrode layer 210 ranges from 20 to 200 nanometers. The refractive index of the transparent auxiliary electrode layer 210 ranges from 1.8 to 2.1. The transparent filling layer 200 is filled in the light transmissive hole 101 and is located on the transparent auxiliary electrode layer 210. The upper surface of the transparent filling layer 200 is flush with the upper surface of the first electrode layer 190 or an upper surface of the transparent auxiliary electrode layer 210 out of the light transmissive hole 101. The material of the transparent filling layer 210 is a transparent organic material with a light transmittance rate greater than 95%, which includes but is not limited to polymethylmethacrylate. The transparent filling layer 200 serves the planarization function for the display panel under the premise of ensuring the light transmittance rate on the region of the light transmissive hole 101. In this embodiment, the transparent filling layer 200 can be specifically referred to the embodiment illustrated in FIG. 4, and the transparent auxiliary electrode layer 210 can be specifically referred to the embodiment illustrated in FIG. 5 and FIG. 6, and redundant description will not be mentioned herein again.

One embodiment of the present disclosure further provides a manufacturing method of the display panel configured to manufacture the display panel provided by any embodiment of the present disclosure. The manufacturing method includes:

S1: manufacturing the pixel definition layer and patterning to form the light transmissive hole in the light transmissive region.

Specifically, a film of the pixel definition layer is manufactured on the second electrode, a set of fine masks is used to pattern the film of the pixel definition layer, while the pixel opening in the pixel region and the light transmissive hole in the light transmissive region are formed at the same time. Wherein, the pixel opening is located in the pixel region, corresponds to the second electrode, and exposes the second electrode, and the light transmissive hole is located in the light transmissive region. The light transmissive hole includes the top opening, the bottom opening, and the lateral wall connected between the top opening and the bottom opening. The size of the top opening is larger than the size of the bottom opening. The distance between the outer edge of the lateral wall at the bottom opening and the outer edge of an adjacent second electrode ranges from 2 to 5 microns.

S2: manufacturing the light emitting unit layer on the pixel definition layer.

Specifically, the first light emitting unit layer is evaporated on the pixel definition layer; the first light emitting unit layer is disposed as an entire layer, covers the pixel region and the light transmissive region, is deposited on the pixel definition layer, covers the opening and the light transmissive hole of the pixel definition layer, and is in contact with the second electrode; the second light emitting unit layer is evaporated on the first light emitting unit layer in the pixel region; wherein the second light emitting unit layer corresponds to the second electrode of the pixel region where it is located, and the second light emitting unit layer is the light emitting material layer and includes the red light emitting material layer, the green light emitting material layer, and the blue light emitting material layer; and the third light emitting unit layer is evaporated on the first light emitting unit layer and the second light emitting unit layer, wherein the third light emitting unit layer is disposed as an entire layer and covers the pixel region and the light transmissive region.

S3: manufacturing the auxiliary layer on the light emitting unit layer in the light transmissive region.

Specifically, a set of fine masks is used for manufacturing the auxiliary layer on the third light emitting unit layer to form the auxiliary portions spaced apart and independent to each other, and the auxiliary portions are located in the corresponding light transmissive holes. Wherein, the distance between the edge of the auxiliary portion and the edge of adjacent pixel regions ranges from 2 to 5 microns, projections of the auxiliary portion on a plane where the second electrode is and the second electrodes do not overlap with each other, the material of the auxiliary layer is an anti-adhesion material, and specifically a material that has weak adhesion and mismatching surface energy to the first electrode layer.

S4: manufacturing the first electrode layer on the light emitting unit layer.

Specifically, the first electrode layer is deposited on the third light emitting unit layer, and the first electrode layer covers the third light emitting unit layer and at least part regions of the auxiliary portions. The material of the auxiliary layer is the anti-adhesion material, the anti-adhesion material does not match with the surface energy of the material of the first electrode layer, and the material of the third light emitting unit layer is a non-adhesion-proof material matching with the surface energy of the material of the first electrode layer. Therefore, an adhesion force of the first electrode layer on the auxiliary layer is less than an adhesion force of the first electrode layer on the third light emitting unit layer 173, and the thickness of the first electrode layer located on the auxiliary layer is less than the thickness of the first electrode layer located on the third light emitting unit layer.

The embodiment of the present disclosure provides the manufacturing method of the display panel. In the manufacturing method, the light transmissive hole is formed in the light transmissive region to remove the pixel definition layer in the light transmissive hole by patterning the pixel definition layer, the light transmittance rate on a region of the light transmissive hole is increased, thereby increasing the light transmittance rate of the first display region, improving the light transmittance rate of the display panel, and improving the imaging effect of the under-screen camera.

Furthermore, the manufacturing method of the display panel provided by one embodiment of the present disclosure can further include manufacturing the transparent auxiliary electrode layer on the first electrode layer. Wherein, the transparent auxiliary electrode layer at least completely covers the auxiliary layer and is electrically connected to the first electrode layer. The material of the transparent auxiliary electrode layer is a transparent conductive material, which includes but is not limited to indium tin oxide, indium zinc oxide, aluminum zinc oxide, indium gallium zinc oxide, or a metal or an alloy less than 60 angstroms. The thickness of the transparent auxiliary electrode layer ranges from 20 to 200 nanometers. The refractive index of the transparent auxiliary electrode layer ranges from 1.8 to 2.1. The transparent auxiliary electrode layer assists the first electrode layer to provide electrical signals to the display panel, reduces an electric resistance rate of the first electrode layer, and increases conductivity of the display panel and reduces voltage drop of the display panel under a premise of not influencing the light transmittance rate of the display panel in the light transmissive region.

Furthermore, the manufacturing method of the display panel provided by one embodiment of the present disclosure can further include manufacturing the transparent filling layer on the first electrode layer or the transparent auxiliary electrode layer. Wherein, the transparent filling layer is filled in the light transmissive hole, and the upper surface of the transparent filling layer is flush with the upper surface of the first electrode layer or the upper surface of the transparent auxiliary electrode layer out of the light transmissive hole. The material of the transparent filling layer is a transparent organic material with a light transmittance rate greater than 95%, which includes but is not limited to polymethylmethacrylate. The transparent filling layer serves the planarization function for the display panel under the premise of ensuring the light transmittance rate on the region of the light transmissive hole.

In one embodiment, the present disclosure further provides a display device. The display device includes any display panel provided by the embodiments of the present disclosure and has technical characteristics and technical effect of any display panel provided by the embodiments of the present disclosure. For specific implementation and working principles, please refer to the aforesaid specific embodiments, and description will not be mentioned herein again.

In summary, the embodiments of the present disclosure provide the display panel, the manufacturing method thereof, and the display device. In the display panel, by defining the light transmissive hole in the light transmissive region of the pixel definition layer to remove the pixel definition layer in the light transmissive hole, the light transmittance rate on a region of the light transmissive hole is increased, thereby increasing the light transmittance rate of the first display region, improving the light transmittance rate of the display panel, and improving the imaging effect of the under-screen camera.

The display panel and the display device provided by the embodiments of the present disclosure are described in detail. This article uses specific cases for describing the principles and the embodiments of the present disclosure, and the description of the embodiments mentioned above is only for helping to understand the method and the core idea of the present disclosure. Meanwhile, for those skilled in the art, will have various changes in specific embodiments and application scopes according to the idea of the present disclosure. In summary, the content of the specification should not be understood as limit to the present disclosure.

What is claimed is:

1. A display panel, comprising a first display region and a second display region, wherein a light transmittance rate of the first display region is greater than a light transmittance rate of the second display region; in the first display region, the display panel comprises pixel regions and light transmissive regions between the pixel regions; and the display panel comprises:
    a pixel definition layer defined with at least one light transmissive hole, wherein the light transmissive hole is located in the corresponding light transmissive region;
    an auxiliary layer comprising at least one auxiliary portion, wherein the auxiliary portion is located in the corresponding light transmissive hole; and
    a first electrode layer located on the auxiliary layer;
    wherein the display panel further comprises a transparent filling layer, and the transparent filling layer is filled in the light transmissive hole and is located on the first electrode layer;
    wherein a material of the transparent filling layer is a transparent organic material with a light transmittance rate greater than 95%.

2. The display panel as claimed in claim 1, wherein the light transmissive hole comprises a top opening, a bottom opening, and a lateral wall, and a size of the top opening is larger than a size of the bottom opening.

3. The display panel as claimed in claim 2, wherein the display panel further comprises a second electrode layer; the pixel definition layer is disposed on the second electrode layer; the second electrode layer comprises a plurality of second electrodes; each of the second electrodes is located in the corresponding pixel regions;
    and a distance between an outer edge of the lateral wall at the bottom opening and an outer edge of an adjacent second electrode ranges from 2 to 5 microns.

4. The display panel as claimed in claim 3, wherein the display panel further comprises a light emitting unit layer; the light emitting unit layer comprises a first light emitting unit layer, a second light emitting unit layer, and a third light emitting unit layer disposed in a stack; the second light emitting unit layer is disposed between the first light emitting unit layer and the third light emitting unit layer; the pixel definition layer comprises a pixel opening corresponding to each of the second electrodes; the first light emitting unit layer is disposed on the pixel definition layer, covers the pixel opening and the light transmissive hole, and is located below the auxiliary layer; the second light emitting unit layer is disposed in the pixel opening; and
    the third light emitting unit layer covers the second light emitting unit layer and the first light emitting unit layer and is located below the auxiliary layer.

5. The display panel as claimed in claim 4, wherein the first electrode layer covers at least a part of regions of the third light emitting unit layer and the auxiliary portion.

6. The display panel as claimed in claim 5, wherein a thickness of the first electrode layer on the auxiliary layer is less than a thickness of the first electrode layer on the light emitting unit layer.

7. The display panel as claimed in claim 2, wherein the auxiliary portion covers the corresponding bottom opening of the light transmissive hole.

8. The display panel as claimed in claim 7, wherein the auxiliary portion comprises a platform portion and an edge portion located at an edge of the platform portion; a thickness of the edge portion gradually decreases along a direction away from the platform portion; and the first electrode layer at least covers part of the edge portion.

9. The display panel as claimed in claim 8, wherein a thickness of the first electrode layer gradually decreases on the edge portion in a direction in which the thickness of the edge portion increases.

10. The display panel as claimed in claim 9, wherein the first electrode layer covers part of the edge portion.

11. The display panel as claimed in claim 9, wherein the first electrode layer completely covers the edge portion.

12. The display panel as claimed in claim 9, wherein the first electrode layer completely covers the auxiliary layer.

13. The display panel as claimed in claim 7, wherein the auxiliary layer covers part of the lateral wall of the light transmissive hole.

14. The display panel as claimed in claim 1, wherein the transparent organic material comprises poly (methyl methacrylate).

15. A display device, comprising a display panel, wherein the display panel comprises a first display region and a second display region; a light transmittance rate of the first display region is greater than a light transmittance rate of the second display region; in the first display region, the display panel comprises pixel regions and light transmissive regions between the pixel regions; and the display panel comprises:
- a pixel definition layer defined with at least one light transmissive hole, wherein the light transmissive hole is located in the corresponding light transmissive region;
- an auxiliary layer comprising at least one auxiliary portion, wherein the auxiliary portion is located in the corresponding light transmissive hole; and
- a first electrode layer located on the auxiliary layer, wherein the first electrode layer covers at least part of a lateral wall of the light transmissive hole;
- wherein the display panel further comprises a transparent filling layer, and the transparent filling layer is filled in the light transmissive hole and is located on the first electrode layer; and
- wherein a material of the transparent filling layer is a transparent organic material with a light transmittance rate greater than 95%.

16. The display device as claimed in claim 15, wherein the light transmissive hole comprises a top opening, a bottom opening, and the lateral wall, and a size of the top opening is larger than a size of the bottom opening.

17. The display device as claimed in claim 16, wherein the display panel further comprises a second electrode layer; the pixel definition layer is disposed on the second electrode layer; the second electrode layer comprises a plurality of second electrodes; each of the second electrodes is located in the corresponding pixel regions;
- and a distance between an outer edge of the lateral wall at the bottom opening and an outer edge of an adjacent second electrode ranges from 2 to 5 microns.

* * * * *